(12) United States Patent
Aoki et al.

(10) Patent No.: US 7,999,441 B2
(45) Date of Patent: Aug. 16, 2011

(54) PIEZOELECTRIC ACTUATOR AND LIQUID DISCHARGE HEAD USING THE SAME

(75) Inventors: Katsumi Aoki, Yokohama (JP); Kenichi Takeda, Yokohama (JP); Toshihiro Ifuku, Yokohama (JP); Takanori Matsuda, Chofu (JP); Tetsuro Fukui, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 226 days.

(21) Appl. No.: 12/237,933

(22) Filed: Sep. 25, 2008

(65) Prior Publication Data

US 2009/0091215 A1    Apr. 9, 2009

(30) Foreign Application Priority Data

Oct. 4, 2007   (JP) ................................. 2007-260942

(51) Int. Cl.
*H01L 41/04*   (2006.01)
(52) U.S. Cl. ...................................... 310/328; 310/330
(58) Field of Classification Search .................. 310/324, 310/328, 330–332; 346/68–70
See application file for complete search history.

(56) References Cited

U.S. PATENT DOCUMENTS

| | | | |
|---|---|---|---|
| 6,883,902 B2 | 4/2005 | Xin-Shan et al. | |
| 7,053,526 B2 | 5/2006 | Unno et al. | |
| 7,059,711 B2 | 6/2006 | Aoto et al. | |
| 7,120,978 B2 | 10/2006 | Wasa et al. | |
| 7,235,917 B2 | 6/2007 | Fukui et al. | |
| 7,309,950 B1 | 12/2007 | Aoki et al. | |
| 2003/0222943 A1* | 12/2003 | Sumi | 347/68 |
| 2004/0135851 A1* | 7/2004 | Xin-Shan et al. | 347/68 |
| 2007/0060467 A1 | 3/2007 | Matsuda et al. | |
| 2008/0012054 A1 | 1/2008 | Ifuku et al. | |
| 2008/0012910 A1 | 1/2008 | Matsuda et al. | |

FOREIGN PATENT DOCUMENTS

JP    2004-42287    2/2004

* cited by examiner

*Primary Examiner* — Derek J Rosenau
(74) *Attorney, Agent, or Firm* — Fitzpatrick, Cella, Harper & Scinto

(57) ABSTRACT

The piezoelectric actuator includes a piezoelectric film between two electrode layers and a diaphragm. Assuming that: each elastic coefficient of all materials is isotropic and a distortion amount of the piezoelectric film by an electric field is isotropic in all in-plane directions; a point located on a diaphragm surface and having a maximum displacement when a predetermined electric field is applied to distort the piezoelectric film, is expressed by $P\delta_{MAX}$; and a point located on a circumference of a reference-circle having $P\delta_{MAX}$ as a center and having a minimum difference in displacement from $P\delta_{MAX}$ is expressed by $P\delta_A$, the diaphragm has a shape capable of determining an axis $A_1$ set in a straight-line joining $P\delta_{MAX}$ and $P\delta_A$, the diaphragm comprises a single-crystal-line-material in which a plane orthogonal to $A_1$ and perpendicular to an axis $A_2$ on the diaphragm surface, is a {110}-plane, and the piezoelectric film is a {100}-single-orientation film.

10 Claims, 14 Drawing Sheets

PIEZOELECTRIC ACTUATOR AND LIQUID DISCHARGE HEAD USING THE SAME

BACKGROUND OF THE INVENTION

1. Field of the Invention

The present invention relates to a piezoelectric actuator including a piezoelectric film sandwiched between two electrode layers and a diaphragm, and a liquid discharge head using the piezoelectric actuator.

2. Description of the Related Art

In a piezoelectric actuator including a piezoelectric film sandwiched between two electrode layers and a diaphragm, when an electrical field is applied between the two electrode layers, the piezoelectric film expands and contracts in a film thickness direction and an in-plane direction. A piezoelectric actuator, which has such a structure that the diaphragm is bent by expansion and contraction of the piezoelectric film in the in-plane direction between the expansion and contraction modes of the piezoelectric film which can be divided into two directions described above, is normally called a bending mode type piezoelectric actuator. The piezoelectric actuator having the above-mentioned structure is widely used because a bending amount of the diaphragm can be obtained as a displacement.

When the piezoelectric film has a film thickness of several μm, the piezoelectric actuator having the above-mentioned structure can be used as, for example, a piezoelectric actuator for an ink jet head.

As a method of forming the piezoelectric film having the above-mentioned film thickness, there is normally used a method of applying, onto the diaphragm, a solution containing a precursor of a piezoelectric material serving as the piezoelectric film and an organic binder by a screen printing method, and then performing drying and baking to form the piezoelectric film. In addition, there is widely used, for example, a method of forming, on the diaphragm, a green sheet including the precursor of the piezoelectric material serving as the piezoelectric film and the organic binder, and then performing baking to form the piezoelectric film.

In recent years, for example, in a case of an ink jet printer onto which an ink jet head is mounted as a piezoelectric actuator utilizing the displacement of the bending mode, the ink jet head is required to have a higher speed and higher image quality.

Therefore, the ink jet head is required to enable precise displacement drive control and stably discharge minute liquid droplets of ink, and to have higher displacement power in order to discharge high-viscosity ink and also in order to increase a density of discharge ports.

In order to realize performance required for the ink jet head, a piezoelectric film whose crystal structure is controlled to obtain high piezoelectric performance has been developed. Such a piezoelectric film is formed by the following film formation methods which are generally known as thin film formation methods.

Sputtering film formation method
  Metal organic chemical vapor deposition (MOCVD) film formation method
  Pulse laser deposition (PLD) film formation method
  Molecular beam epitaxy (MBE) film formation method
  Chemical solution deposition (CSD) (=sol-gel method) film formation method According to the above-mentioned film formation methods, the piezoelectric film can be directly formed on a target, and thus the film formation methods can be used for minute processing using a semiconductor manufacturing process.

Therefore, attention has been focused on the film formation methods as effective methods of manufacturing a piezoelectric actuator having a minute structure, such as a micro electro mechanical system (MEMS).

For example, Japanese Patent Application Laid-Open No. 2004-042287 discloses a liquid discharge head including a piezoelectric element including a lower electrode, a piezoelectric layer, and an upper electrode which are provided, through a diaphragm, on a surface side of a substrate serving as a flow path of an ink jet head. In the liquid discharge head, a zirconium oxide layer, a cerium oxide layer, and a superconductor layer made of an yttrium-barium-copper-oxide-based material (YBCO) are provided on the substrate. The lower electrode made of strontium ruthenate and formed on the superconductor layer, the piezoelectric layer formed on the lower electrode, and the upper electrode formed on the piezoelectric layer are also provided. Japanese Patent Application Laid-Open No. 2004-042287 discloses that a Pb(Zr, Ti)O$_3$ (PZT) film is formed on the lower electrode by the sol-gel method to realize single crystallization of a PZT crystal structure, and the piezoelectric layer having (100) orientation is obtained, whereby liquid discharge with a uniform piezoelectric characteristic can be performed at maximum output. Further, Japanese Patent Application Laid-Open No. 2004-042287 discloses in the second and third aspects, when the crystal plane orientation of the piezoelectric layer is (100) orientation in the above-mentioned structure, the piezoelectric characteristics can be substantially improved.

A piezoelectric actuator, in particular, a piezoelectric actuator utilizing the bending mode in a case where a thin film formation method is employed has a structure in which a distortion of the piezoelectric film is converted into a bending of the diaphragm. Therefore, in order to bring out the substantial performance such as the bending amount in the piezoelectric actuator including the diaphragm and the piezoelectric film sandwiched between the two electrodes, not only the distortion performance of the piezoelectric film, but also a relative relationship between the piezoelectric film and the diaphragm are extremely important. That is, in order to effectively use the excellent piezoelectric characteristics of the piezoelectric film for the piezoelectric actuator having the bending mode, it is important to design the piezoelectric actuator in view of the relative relationship between the piezoelectric film and the diaphragm, which substantially determines the performance of the piezoelectric actuator. In particular, it is important to make compatible a displacement amount of the piezoelectric actuator with a response of the piezoelectric actuator to a driving waveform thereof.

SUMMARY OF THE INVENTION

It is an object of the present invention to provide a piezoelectric actuator which can be applied as a piezoelectric actuator having a minute structure such as a MEMS and has excellent displacement controllability in which a displacement amount is large and a response to a driving waveform is good.

In order to solve the above-mentioned problem, the inventors of the present invention have made various studies on a structure of the piezoelectric actuator capable of effectively using a piezoelectric film having excellent piezoelectric characteristics, and thus completed the present invention.

To solve the above-mentioned problem, the present invention includes the following.

(1) A piezoelectric actuator comprising: a diaphragm; and a piezoelectric element provided on the diaphragm, including a pair of electrode layers and a piezoelectric film sandwiched between the pair of electrode layers, in which each elastic coefficient of the pair of electrode layers, the piezoelectric film and the diaphragm is isotropic in three-dimensional directions, an amount of distortion of the piezoelectric film which is caused by an electric field is isotropic in all in-plane directions of the piezoelectric film, a point located on a principal surface of the diaphragm and having a maximum displacement amount when a predetermined electric field is applied between the pair of electrode layers and the piezoelectric film is distorted to bend the diaphragm by the distortion, is expressed by $P\delta_{MAX}$, and a point located on the surface of the diaphragm and on a circumference of a reference circle having the point $P\delta_{MAX}$ as a center and a radius smaller than a distance between an end portion of the diaphragm and the point $P\delta_{MAX}$, and having a minimum difference in displacement amount from the point $P\delta_{MAX}$, is expressed by $P\delta_A$: the diaphragm has a shape capable of uniquely determining an axis $A_1$ located on the principal surface of the diaphragm when the diaphragm is not bent, and set in a direction of a straight line joining the point $P\delta_{MAX}$ and the point $P\delta_A$; the diaphragm comprises a single-crystalline material in which a plane orthogonal to the axis $A_1$ and perpendicular to an axis $A_2$ located on the principal surface of the diaphragm, is a $\{110\}$ plane; and the piezoelectric film comprises a single-crystalline piezoelectric film including a $\{100\}$ plane perpendicular to the axis $A_2$.

(2) A piezoelectric actuator comprising: a diaphragm; and a piezoelectric element provided on the diaphragm, including a pair of electrode layers and a piezoelectric film sandwiched between the pair of electrode layers, in which the diaphragm has a shape other than a circle and with at least one symmetry axis, a longest symmetry axis among axes passing through a shape of the diaphragm, is expressed as an axis $A_{1'}$, and an axis located on a flat surface of the diaphragm and being orthogonal to the axis $A_{1'}$, is expressed as an axis $A_{2'}$, the diaphragm includes a single-crystalline material in which a plane perpendicular to the axis $A_{2'}$, is a $\{110\}$ plane; and the piezoelectric film comprises a single-crystalline piezoelectric film including a $\{100\}$ plane perpendicular to the axis $A_{2'}$.

(3) A piezoelectric actuator comprising: a diaphragm; and a piezoelectric element provided on the diaphragm, including a pair of electrode layers and a piezoelectric film sandwiched between the pair of electrode layers, in which the diaphragm has a shape devoid of a symmetry axis but including a symmetry center, an axis in a direction of a straight line joining a pair of points closest to the symmetry center on an end surface of the diaphragm, is expressed as an axis $A_{2'}$, and an axis located on a flat surface of the diaphragm and being orthogonal to the axis $A_{2'}$, is expressed as an axis $A_{1'}$, the diaphragm includes a single-crystalline material in which a plane perpendicular to the axis $A_{2'}$, is a $\{110\}$ plane; and the piezoelectric film comprises a single-crystalline piezoelectric film including a $\{100\}$ plane perpendicular to the axis $A_{2'}$.

According to the present invention, it is possible to provide the piezoelectric actuator having the excellent displacement controllability in which the displacement amount is large and the response to the driving waveform is excellent, and a liquid discharge head effectively using the piezoelectric actuator.

Further features of the present invention will become apparent from the following description of exemplary embodiments with reference to the attached drawings.

BRIEF DESCRIPTION OF THE DRAWINGS

FIGS. 10A, 10B and 10C illustrate a relationship between the SOI substrate and the shape of the diaphragm of the manufactured piezoelectric actuator according to the present invention, in which FIG. 10A illustrates cutting of chips of liquid discharge heads, FIG. 10B illustrates a shape and an arrangement of diaphragms of respective piezoelectric actuators of the manufactured liquid discharge heads, and FIG. 10C illustrates a relationship between the shape of the diaphragm of the piezoelectric actuator and axes $A_1$ and $A_2$.

FIGS. 14A, 14B and 14C illustrate a relationship between an Si (100) substrate and a shape of a diaphragm of a piezoelectric actuator according to Comparative Example 1, in which FIG. 14A illustrates cutting of chips of liquid discharge heads, FIG. 14B illustrates a shape and an arrangement of diaphragms of respective piezoelectric actuators of the manufactured liquid discharge heads, and FIG. 14C illustrates a relationship between the shape of the diaphragm of the piezoelectric actuator and the axes $A_1$ and $A_2$.

DESCRIPTION OF THE EMBODIMENTS

Figure 1A:
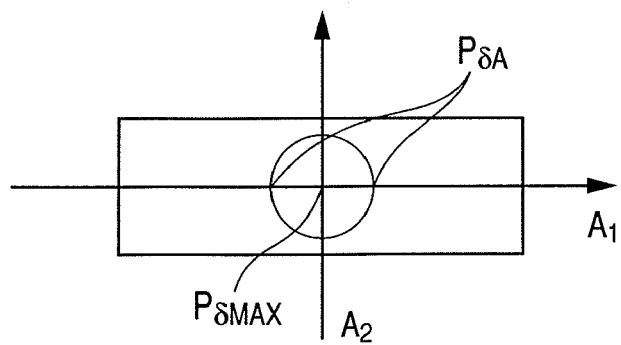
FIGS. 1A, 1B, 1C, 1D, 1E, 1F and 1G illustrate examples of a shape of a diaphragm of a piezoelectric actuator.

Hereinafter, a piezoelectric actuator according to a first embodiment of the present invention is a piezoelectric actuator including a piezoelectric film sandwiched between two electrode layers and a diaphragm. The diaphragm and the piezoelectric film satisfy the following requirements (e), (f), and (g) under the following conditions (a), (b), (c), and (d).

(a) Assume that each of the pair of electrode layers, the piezoelectric film, and the diaphragm has the same elastic coefficient in all directions.

(b) Assume that the amount of distortion of the piezoelectric film which is caused by an electric field is the same in all in-plane directions of the piezoelectric film.

(c) Assume that a point corresponding to a maximum amount of displacement on a principal surface of the diaphragm in a case where a predetermined electric field is applied between the pair of electrode layers to distort the piezoelectric film, thereby bending the diaphragm by the distortion, is expressed by $P\delta_{MAX}$.

(d) Assume that a point on the surface of the diaphragm, which is located on the circumference of a reference circle whose center is the point $P\delta_{MAX}$ and radius is smaller than a distance to an end portion of the diaphragm and which has a minimum difference in displacement amount from the point $P\delta_{MAX}$, is expressed by $P\delta_A$.

(e) The diaphragm has a shape capable of uniquely determining an axis $A_1$ which is located on the principal surface of the diaphragm (not bent) and set in a direction of a straight line joining the point $P\delta_{MAX}$ and the point $P\delta_A$.

(f) The diaphragm is made of a single-crystalline material having a {110} plane which is orthogonal to the axis $A_1$ and perpendicular to an axis $A_2$ located on the principal surface of the diaphragm.

(g) The piezoelectric film is a single-crystalline piezoelectric film having a {100} plane perpendicular to the axis $A_2$.

A piezoelectric actuator according to a second embodiment of the present invention is a piezoelectric actuator including a piezoelectric film sandwiched between two electrode layers and a diaphragm. The diaphragm and the piezoelectric film satisfy the following requirements (a), (b), and (c).

(a) The diaphragm has a shape which includes at least one symmetry axis and is other than a circle.

(b) When a symmetry axis which is longest among axes passing through the shape of the diaphragm is expressed as an axis $A_{1'}$ and when an axis which is located on a flat surface of the diaphragm and orthogonal to the axis $A_{1'}$ is expressed as an axis $A_{2'}$, the diaphragm is made of a single-crystalline material having a {110} plane perpendicular to the axis $A_{2'}$.

(c) The piezoelectric film is a single-crystalline piezoelectric film having a {100} plane perpendicular to the axis $A_{2'}$.

A piezoelectric actuator according to a third embodiment of the present invention is a piezoelectric actuator including a piezoelectric film sandwiched between two electrode layers and a diaphragm. The diaphragm and the piezoelectric film satisfy the following requirements (a), (b), and (c).

(a) The diaphragm has a shape which includes not a symmetry axis but a symmetry center.

(b) When an axis in a direction of a straight line joining a pair of points closest to the symmetry center on an end surface of the diaphragm is expressed as an axis $A_{2'}$, and when an axis which is located on a flat surface of the diaphragm and perpendicular to the axis $A_{2'}$ is expressed as an axis $A_{1'}$, the diaphragm is made of a single-crystalline material having a {110} plane perpendicular to the axis $A_{2'}$.

(c) The piezoelectric film is a single-crystalline piezoelectric film having a {100} plane perpendicular to the axis $A_{2'}$.

The points $P\delta_{MAX}$ and $P\delta_A$ and the axes $A_1$ and $A_2$ which are specified in the piezoelectric actuator according to the first embodiment can be determined as follows.

For example, a piezoelectric actuator model corresponding to the piezoelectric actuator according to each of the embodiments of the present invention is estimated to determine design elements such as a shape and size of each of members included in the piezoelectric actuator model. A piezoelectric material, a diaphragm material, and an electrode material, which are to be used, are estimated to set property values such as elastic coefficients in a case where the materials can be assumed to be isotropic. Assumed that each of materials included in the piezoelectric actuator model has an isotropic elastic term and the amount of distortion of the piezoelectric film is the same in all in-plane directions. Structural analysis is performed by a numerical analysis method such as a finite element method to obtain the points $P\delta_{MAX}$ and $P\delta_A$ and the axes $A_1$ and $A_2$. Then, it may be confirmed that the diaphragm of the estimated piezoelectric actuator model has the shape capable of determining the axis $A_1$ which is located on the flat surface of the diaphragm (not bent) and set in the direction of the straight line joining the point $P\delta_{MAX}$ and the point $P\delta_A$.

There is a case where the points $P\delta_{MAX}$ and $P\delta_A$ and the axes $A_1$ and $A_2$ can be determined based on the shape of the diaphragm of the piezoelectric actuator without performing the structural calculation of the piezoelectric actuator model.

Hereinafter, the case where the points $P\delta_{MAX}$ and $P\delta_A$ and the axes $A_1$ and $A_2$ can be determined based on the shape of the diaphragm of the piezoelectric actuator will be described with reference to the drawings.

FIGS. 1A to 1G illustrate examples of the shape of the diaphragm of the piezoelectric actuator.

Figure 1B:
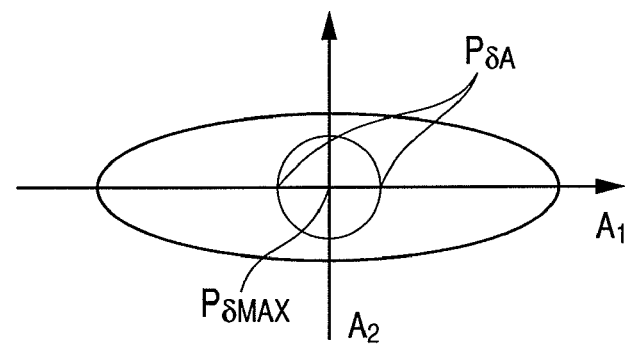
Figure 1C:
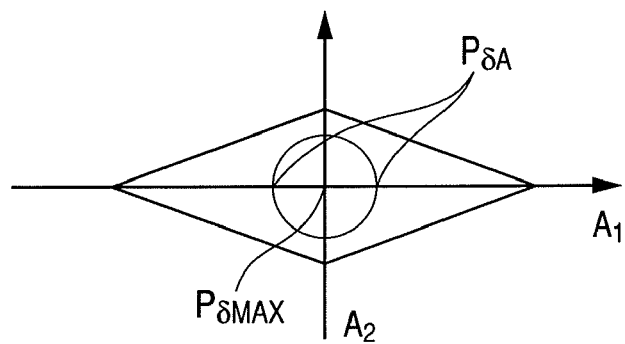
Figure 1D:
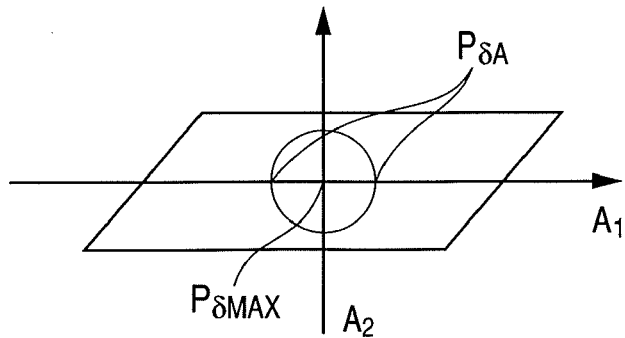
Figure 1E:
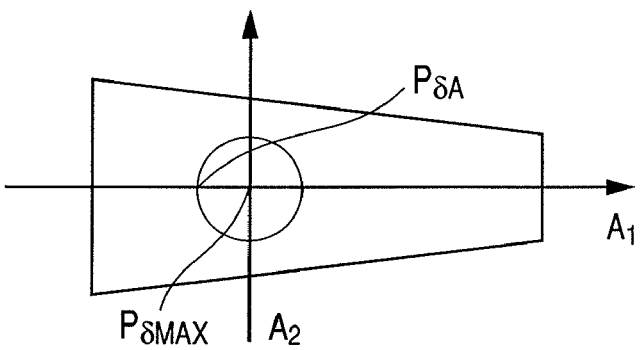
Figure 1F:
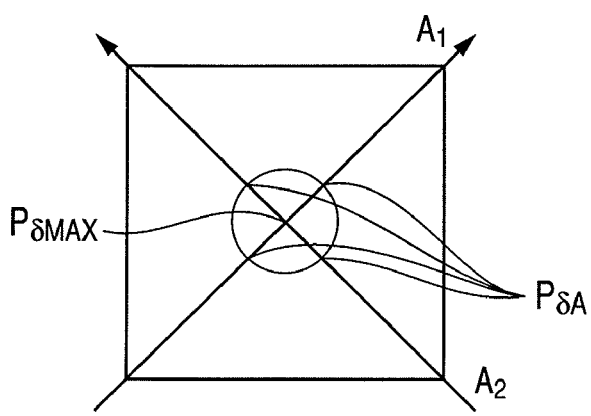
Figure 1G:
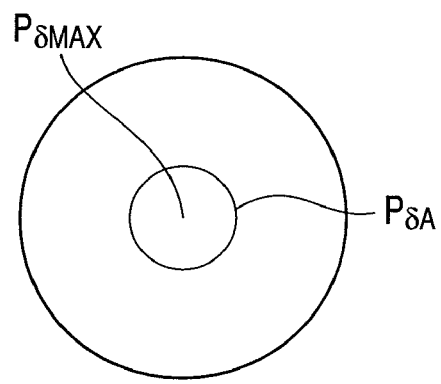

FIG. 1A illustrates an example of a diaphragm having a rectangular shape. FIG. 1B illustrates an example of a diaphragm having an elliptical shape. FIG. 1C illustrates an example of a diaphragm having a diamond shape. FIG. 1D illustrates an example of a diaphragm having a parallelogram shape. FIG. 1E illustrates an example of a diaphragm having an isosceles trapezoid shape. FIG. 1F illustrates an example of a diaphragm having a square shape. FIG. 1G illustrates an example of a diaphragm having a circular shape. Each of FIGS. 1A to 1G illustrates, in a case where the diaphragm is bent still, (1) the point $P\delta_{MAX}$ at which the amount of displacement is maximum and (2) the point $P\delta_A$ on the surface of the diaphragm, which is located on the circumference of the reference circle whose center is the point $P\delta_{MAX}$ and radius is smaller than the distance to the end portion of the diaphragm and which has the minimum difference in displacement amount from the point $P\delta_{MAX}$. In the case of the piezoelectric actuator capable of determining the axis $A_1$ which is located on the flat surface of the diaphragm when the diaphragm is not bent and set in the direction of the straight line joining the point $P\delta_{MAX}$ and the point $P\delta_A$, the axis $A_2$ which is orthogonal to the axis $A_1$ and located on the flat surface of the diaphragm is also illustrated.

In a case where the shape of the diaphragm includes two symmetry axes orthogonal to each other, an intersection of the symmetry axes is the point $P\delta_{MAX}$ at which the amount of displacement is maximum. The diaphragms illustrated in FIGS. 1A, 1B, and 1C correspond to such a case. In this case, with respect to the point $P\delta_A$ on the surface of the diaphragm, which is located on the circumference of the reference circle whose center is the point $P\delta_{MAX}$ and radius is smaller than the distance to the end portion of the diaphragm and which has the minimum difference in displacement amount from the point $P\delta_{MAX}$, there exist two points on the longitudinal symmetry axis of the shape of the diaphragm. That is, the axis $A_1$ specified in the present invention is the longitudinal symmetry axis of the diaphragm, and hence the axes $A_1$ and $A_2$ can be uniquely determined.

Next, the parallelogram shape of the diaphragm illustrated in FIG. 1D is the example of the shape having the symmetry center. The symmetry center corresponds to the point $P\delta_{MAX}$. In this case, there exists, on a line which passes through the point $P\delta_{MAX}$ and is parallel to the long side of the parallelogram, the point $P\delta_A$ on the surface of the diaphragm, which is located on the circumference of the reference circle whose center is the point $P\delta_{MAX}$ and radius is smaller than the distance to the end portion of the diaphragm and which has the minimum difference in displacement amount from the point $P\delta_{MAX}$. In other words, the axis $A_1$ specified in the present invention is identical to the line which passes through the point $P\delta_{MAX}$ and is parallel to the long side of the parallelogram. In the case of the diaphragm having the parallelogram shape, the axes $A_1$ and $A_2$ can be uniquely determined.

Next, the isosceles trapezoid shape of the diaphragm illustrated in FIG. 1E is the example of the shape having the single symmetry axis. In the case of the diaphragm having the isosceles trapezoid shape as illustrated in FIG. 1E, the points $P\delta_{MAX}$ and $P\delta_A$ are located on a center line of two sides parallel to each other, that is, on the symmetry axis. In other words, the axis $A_1$ specified in the present invention is identical to the symmetry axis of the diaphragm, and hence the axes $A_1$ and $A_2$ can be uniquely determined.

Next, in the case of the diaphragm having the square shape as illustrated in FIG. 1F, the center of the square which is the symmetry center corresponds to the point $P\delta_{MAX}$. In this case, with respect to the point $P\delta_A$ which is located on the circumference of the reference circle whose center is the point $P\delta_{MAX}$ and radius is smaller than the distance to the end portion of the diaphragm and which has the minimum difference in displacement amount from the point $P\delta_{MAX}$, there exist the points $P\delta_A$ at four intersections between two diagonal lines and the circumference of the reference circle as illustrated in FIG. 1F. The two diagonal lines also serve as the symmetry axes and thus are equivalent to each other. Therefore, even when the axis $A_1$ is determined as any one of the symmetry axes, the diaphragm having the equivalent shape is obtained, with the result that the axes $A_1$ and $A_2$ can be uniquely determined.

Next, in the case of the diaphragm having the circular shape as illustrated in FIG. 1G, the center of the circle which is the symmetry center corresponds to the point $P\delta_{MAX}$. In this case, the point $P\delta_A$ on the surface of the diaphragm, which is located on the circumference of the reference circle whose center is the point $P\delta_{MAX}$ and radius is smaller than the distance to the end portion of the diaphragm and which has the minimum difference in displacement amount from the point $P\delta_{MAX}$, corresponds to each of all points on the circumference of the reference circle. In other words, in such a case, the axes $A_1$ and $A_2$ cannot be uniquely determined. Therefore, the diaphragm having the shape as illustrated in FIG. 1G does not correspond to the diaphragm of the piezoelectric actuator according to each of the first and second embodiments of the present invention.

In the case where the shape of the diaphragm is specified as described above, when it is assumed that the diaphragm is made of a single-crystalline material having a $\{100\}$ plane perpendicular to the axis $A_2$, the elastic coefficient of the diaphragm greatly influences displacement performance in the bending mode.

A material with a crystal structure has an elastic coefficient changed for each crystal orientation. For example, in a case of an Si (100) wafer (or substrate) whose surface is a $\{100\}$ plane, a side surface thereof has a $\{100\}$ plane and a $\{110\}$ plane which are alternatively located for each 45°. In this case, an elastic coefficient in a <100> orientation is minimum and an elastic coefficient in a <110> orientation is maximum. Intermediate elastic coefficients in orientations between the <100> orientation and the <110> orientation are continuous.

The <110> orientation in which the elastic coefficient is maximum greatly influences the displacement performance in the bending mode. In the piezoelectric actuator according to each of the first and second embodiments of the present invention, the diaphragm is made of the single-crystalline material having the $\{110\}$ plane perpendicular to the axis $A_2$. With such a structure, a resonance frequency of the piezoelectric actuator becomes higher, and hence the response to the driving waveform is improved. In this case, a plane orientation difference between a plane perpendicular to the axis $A_2$ and the $\{110\}$ plane of the single-crystalline material may be within a range equal to or smaller than ±5°.

The piezoelectric actuator according to the first embodiment is the piezoelectric actuator including the piezoelectric film sandwiched between the two electrode layers and the diaphragm. The piezoelectric film is the single-crystalline piezoelectric film having the $\{100\}$ plane perpendicular to the axis $A_2$. Therefore, a high piezoelectric characteristic can be obtained. Thus, even in the case of the diaphragm whose elastic coefficient is high, a large amount of displacement can be obtained.

The single-crystalline piezoelectric film is used as the piezoelectric film, and hence the orientation of the piezoelectric film can be selected correspondingly to the orientation of the diaphragm which greatly influences the displacement performance in the bending mode. When the plane perpendicular to the axis $A_2$ as described above is aligned with the $\{100\}$ plane of the piezoelectric film, higher displacement performance can be obtained.

The piezoelectric actuator according to the second embodiment of the present invention is also the piezoelectric actuator including the piezoelectric film sandwiched between the two electrode layers and the diaphragm. In this embodiment, the diaphragm has the shape which includes at least one symmetry axis and is other than the circle. When the symmetry axis which is longest among the axes passing through the shape of the diaphragm is expressed as the axis $A_{1'}$ and when the axis which is located on the flat surface of the diaphragm and orthogonal to the axis $A_{1'}$ is expressed as the axis $A_{2'}$, the diaphragm is made of the single-crystalline material having the $\{110\}$ plane perpendicular to the axis $A_{2'}$. The piezoelectric film is the single-crystalline piezoelectric film having the {100} plane perpendicular to the axis $A_{2'}$.

The piezoelectric actuator according to the third embodiment of the present invention is also the piezoelectric actuator including the piezoelectric film sandwiched between the two electrode layers and the diaphragm. In this embodiment, the diaphragm has the shape which includes not the symmetry axis but the symmetry center. Assume that the axis in the direction of the straight line joining the pair of points closest to the symmetry center on the end surface of the diaphragm is expressed as the axis $A_{2'}$. Assume that the axis which is located on the flat surface of the diaphragm and perpendicular to the axis $A_{2'}$ is expressed as the axis $A_1$. In such a case, the diaphragm is made of the single-crystalline material having the {110} plane perpendicular to the axis $A_{2'}$. The piezoelectric film is the single-crystalline piezoelectric film having the {100} plane perpendicular to the axis $A_{2'}$.

The piezoelectric actuator according to each of the second and third embodiments of the present invention corresponds to, of the piezoelectric actuators in the first embodiment, the piezoelectric actuator including the diaphragm which has the shape which includes at least one symmetry axis and is other than the circle or the shape including the symmetry center.

Desirable structural examples of the piezoelectric actuator according to each of the first, second, and third embodiments can further include the following structures.

That is, the piezoelectric actuator according to any one of the first, second, and third embodiments is a piezoelectric actuator including a diaphragm made of Si or a material containing Si. Si or the material containing Si is suitable to manufacture a piezoelectric actuator having a minute structure such as a MEMS because minute processing technology using a photolithography technique in a semiconductor process is established.

In the piezoelectric actuator, the diaphragm is desirably made of a material containing one of YSZ{100}/Si(100) and ceria/YSZ{100}/Si(100). When the material is used, the first embodiment of the present invention can be easily realized. When the diaphragm contains YSZ {100}, it is possible to obtain a piezoelectric actuator whose elastic coefficient is large and drive control is excellent.

In the piezoelectric actuator, each of the electrode layers desirably includes an oxide electrode layer having an $ABO_3$ type perovskite structure with a {100} single orientation. When each of the electrode layers includes the oxide electrode layer having the $ABO_3$ type perovskite structure with the {100} single orientation, a conductivity sufficient to serve as the electrode layer can be ensured. One of the single-crystalline piezoelectric film and the single-orientation piezoelectric film can be formed as an upper-layer film having high crystallinity. A strontium ruthenium oxide ($SrRuO_3$ (SRO)) electrode layer is particularly suitable as the oxide electrode layer having the $ABO_3$ type perovskite structure.

The piezoelectric film is desirably made of a PZT-based piezoelectric material. Alternatively, the piezoelectric film is desirably made of a relaxor-based piezoelectric material. When such a material is used, the piezoelectric actuator in which the piezoelectric characteristic is high and the amount of displacement is large can be obtained. A relaxor-based piezoelectric material expressed by any of the following formulae can be desirably used as the relaxor-based piezoelectric material.

  (1)

  (2)

  (3)

  (4)

  (5)

  (6)

  (7)

(x in the above formulae denotes real number of 0<x<1)

The relaxor-based piezoelectric materials expressed by General Formulae (1) to (4) are expressed by PMN-PT (General Formula (1)), PZN-PT (General Formula (2)), PNN-PT (General Formula (3)), and PIN-PT (General Formula (4)). In addition, the relaxor-based piezoelectric materials expressed by General Formulae (5) to (7) are expressed by PSN-PT (General Formula (5)), PYN-PT (General Formula (6)), and PST-PT (General Formula (7)).

The liquid discharge head according to the present invention is a liquid discharge head using any one of the above-mentioned piezoelectric actuators. When the piezoelectric actuator according to the present invention is used, an effect thereof can be effectively used.

The piezoelectric actuator according to the present invention will be described.

[Piezoelectric Actuator]

The piezoelectric actuator using the bending mode according to the present invention will be described with reference to the drawings.

The piezoelectric actuator according to the present invention is the piezoelectric actuator including the piezoelectric film sandwiched between the two electrode layers and the diaphragm. The piezoelectric actuator includes a distortion/stress generation portion which includes the two electrode layers for applying a driving voltage to the piezoelectric film and the piezoelectric film sandwiched therebetween.

Figure 2A:
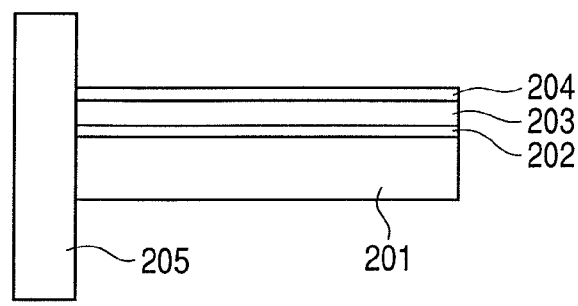
FIGS. 2A, 2B, 2C and 2D illustrate fundamental structures of a unimorph piezoelectric actuator which is an example of a piezoelectric actuator according to embodiments of the present invention.
Figure 2B:
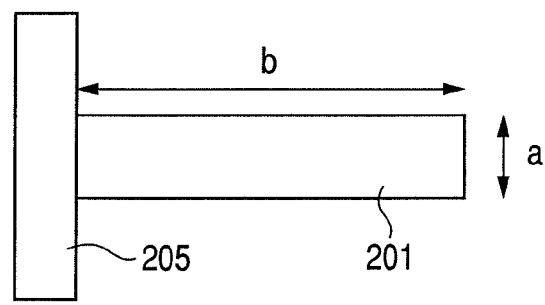

FIGS. 2A and 2B illustrate a fundamental structure of a unimorph cantilever which is an example of the piezoelectric actuator according to the present invention using the bending mode of the piezoelectric film. FIG. 2A is a side cross sectional view and FIG. 2B is a top view. In FIGS. 2A and 2B, the cantilever includes a diaphragm 201, a lower electrode layer 202, a piezoelectric film 203, an upper electrode layer 204, and a cantilever holding portion 205. When a voltage is applied between the upper electrode layer 204 and the lower electrode layer 202, the piezoelectric film 203 expands and contracts in in-plane directions b, and hence an open end of the cantilever vibrates upwardly and downwardly in directions a. Such piezoelectric actuator (unimorph cantilever) is used for, for example, mirror driving of an optical scanner.

Figure 2C:
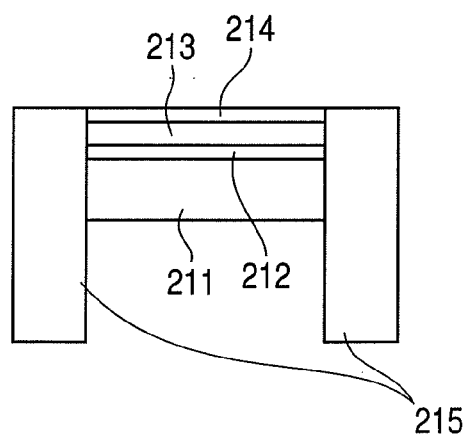
Figure 2D:
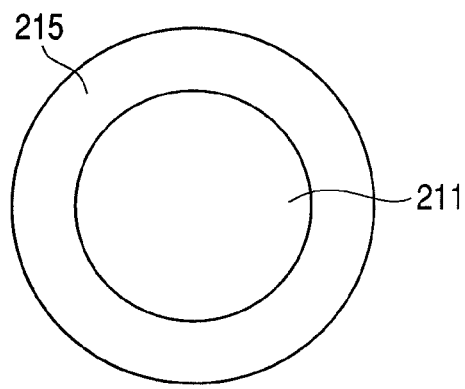

FIGS. 2C and 2D illustrate a fundamental structure of a unimorph actuator which is another example of the piezoelectric actuator according to the present invention using the bending mode of the piezoelectric film. FIG. 2C is a side cross sectional view and FIG. 2D is a top view. In FIGS. 2C and 2D, the actuator includes a diaphragm 211, a lower electrode layer 212, a piezoelectric film 213, an upper electrode layer 214, and an actuator holding base 215. When a voltage is applied between the upper electrode layer 214 and the lower electrode layer 212, the piezoelectric film 213 expands and contracts in in-plane directions, and hence the diaphragm 211 vibrates upwardly and downwardly while the amount of displacement is maximum in a central portion of the actuator. Such piezoelectric actuator is used for, for example, a liquid discharge head.

Next, examples of constituent elements related to the piezoelectric actuator according to the present invention, a liquid discharge head to which the piezoelectric actuator according to the present invention can be suitably applied, and an ink jet printer using the liquid discharge head will be described.

[Piezoelectric Film]

The piezoelectric film in the present invention can be normally formed by, for example, the following film formation methods which are generally known as thin film formation methods.

Sputtering film formation method

Metal organic chemical vapor deposition (MOCVD) film formation method

Pulse laser deposition (PLD) film formation method

Molecular beam epitaxy (MBE) film formation method

Chemical solution deposition (CSD) film formation method

Of the film formation methods described above, the sputtering film formation method is a desirable film formation method.

The piezoelectric film is made of a material which exhibits an effect generally called a reverse piezoelectric effect in which a crystal structure thereof is distorted to generate a displacement when an electric field is applied thereto and which exhibits an effect generally called a piezoelectric effect in which an internal electric field is generated by electrolysis when mechanical distortion is applied thereto.

The piezoelectric film in the present invention is one of the {100} single-orientation film and the single-crystalline piezoelectric film having the {100} plane perpendicular to axis $A_2$ or $A_{2'}$.

[Piezoelectric Material]

In the present invention, it is possible to suitably use a ferroelectric material group having the perovskite structure, such as a material called particularly a relaxor-based piezoelectric material. A material normally called a PZT-based piezoelectric material is also effective.

[PZT-Based Piezoelectric Material]

The PZT-based piezoelectric material which can be used in the present invention is made of a compound expressed by the following General Formula (8).

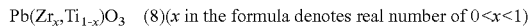

$Pb(Zr_x,Ti_{1-x})O_3$ (8)($x$ in the formula denotes real number of $0<x<1$)

The principal components expressed by the general formula described above may be added as appropriate with an element substituting for one of Pb, Zr, and Ti. Examples of the added element include La, Ca, Nd, Nb, Ta, Sb, Bi, Si, Cr, Fe, Sc, Sr, and Pb.

[Relaxor-Based Piezoelectric Material]

The relaxor-based piezoelectric material is the ferroelectric material group. This name is used because the dependence of a dielectric constant on temperature generally exhibits a broad shape. Examples of the relaxor-based piezoelectric material used in the present invention can include PMN-PT, PZN-PT, PNN-PT, PIN-PT, PSN-PT, PYN-PT, and PST-PT, which are expressed by General Formulae (1) to (7) described above.

[Single Orientation/Single Crystal]

Figure 3A:
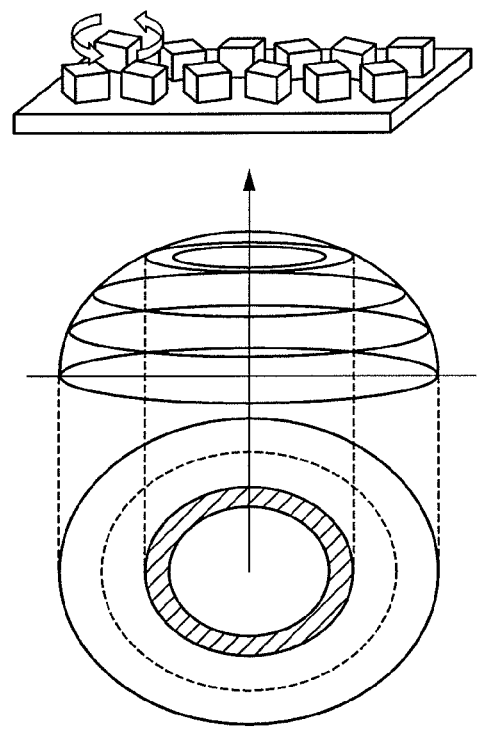
FIGS. 3A and 3B are schematic views illustrating a crystal orientation of each of a single-orientation film and a single-crystalline film and poles obtained by X-ray diffraction.

The single orientation in the present invention indicates that the single crystal orientation in the film thickness direction is included. The in-plane orientation of the film is particularly not held. For example, the {100} single-orientation film is a film made of crystal whose crystal orientation in the film thickness direction is only <100>. Whether or not a film is the single-orientation film can be confirmed by X-ray diffraction. For example, in a case of the piezoelectric film having the PZT perovskite structure with the {100} single orientation, only peaks of (L00) planes (L=1, 2, 3, . . . , n (n is integer)) such as {100} and {200} are detected as peaks resulting from the film by 2θ/θ measurement of the X-ray diffraction. When a {110} non-symmetrical plane is subjected to polar measurement, as illustrated in FIG. 3A, a ring pattern is obtained at the same radius position corresponding to a tilt of approximately 45° relative to the center.

The single-crystalline film in the present invention is made of crystal having the single crystal orientation in the film thickness direction and the film in-plane directions. For example, the {100} single-crystalline film is made of crystal whose orientation in the film thickness direction is only <100> and whose orientation in one of the film in-plane directions is a specific crystal orientation, for example, only <110>.

Figure 3B:
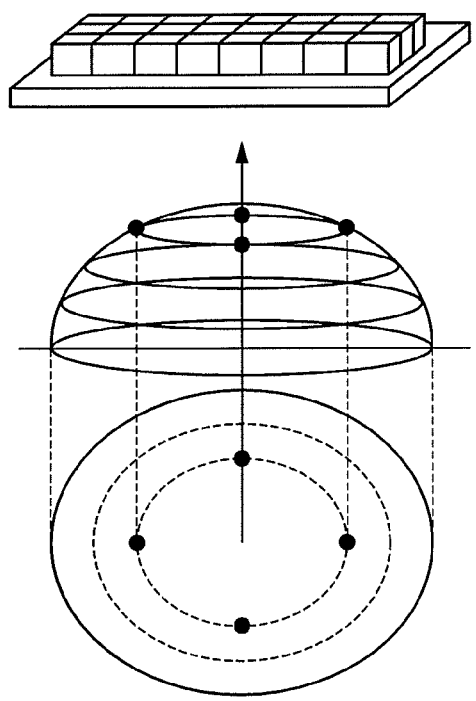

Whether or not a film is the single-crystalline film can be confirmed by X-ray diffraction. For example, in a case of the {100} single-crystalline film having the PZT perovskite structure, only peaks of {L00} planes (L=1, 2, 3, . . . , n (n is integer)) such as {100} and {200} are detected by 2θ/θ measurement of the X-ray diffraction. When a {110} non-symmetrical plane is subjected to polar measurement, as illustrated in FIG. 3B, four-fold symmetry spot patterns are obtained at intervals of 90° in the same radius positions corresponding to the tilt of approximately 45° relative to the center.

For example, in the case of the piezoelectric film having the PZT perovskite structure, when the {110} non-symmetrical plane is subjected to polar measurement, there is a film in which eight-fold or twelve-fold symmetry patterns are obtained in the same radius positions corresponding to the tilt of approximately 45° relative to the center, or a film in which not the spot patterns but elliptical patterns are obtained. The films each have an intermediate symmetry between the single-crystalline film and the single-orientation film. In the present invention, the former is assumed to be the single-crystalline film in the broad sense because the former is close to the single-crystalline film. The latter is assumed to be the single-orientation film because the latter is close to the single-orientation film. For example, even in a case where multiple crystal phases such as a set of monoclinic crystal and tetragonal crystal, a set of monoclinic crystal and rhombohedral crystal, a set of tetragonal crystal and rhombohedral crystal, and a set of all those crystals are intermingled (phase-mixed), even in a case where crystals resulting from a twin crystal are intermingled, and even in a case where there are a dislocation and a defect, when the patterns are exhibited, the film is assumed to be one of the single-crystalline film and the single-orientation film in the broad sense.

In the present invention, epitaxial growth means a film growth process including the growth of a film resulting from a crystal structure of a substrate while the material is being formed into a film by a thin film formation method. Further, the epitaxial growth means a growth process in a case where the resultant film is one of the single-orientation film and the single-crystalline film.

[Electrode Layer]

In view of the structure, the electrode layers of the piezoelectric actuator according to the present invention can be divided into the lower electrode layer located between the diaphragm and the piezoelectric film in the piezoelectric actuator according to the present invention and the upper electrode layer opposed to the lower electrode layer through the piezoelectric film.

When the electrode material is a conductive material capable of effectively applying an electric field to the piezoelectric film by the lower electrode layer and the upper electrode layer, the electrode material is not particularly limited, and thus any electrode material may be used. Examples of the electrode material which can be used in the present invention can include a metal material such as Au, Pt, Ir, Al, Ti, or Ta and a metal oxide material such as $IrO_2$ or $RuO_2$. Each of the lower electrode layer and the upper electrode layer may have a multilayer structure. In this case, one of the lower electrode layer and the upper electrode layer desirably includes a conductive oxide layer.

A minimum thickness of each of the lower electrode layer and the upper electrode layer is determined as a minimum thickness for providing electrical conductivity necessary to effectively apply an electric field to the piezoelectric film by the electrodes. The minimum thickness can be determined based on the conductivity of the electrode material or a dimension of the piezoelectric actuator.

A thickness necessary to also serve as the diaphragm of the bending mode type piezoelectric actuator can be set as a maximum thickness of the lower electrode layer. The upper electrode layer is desirably minimized in thickness because the upper electrode layer serves as only a load in a lateral vibration mode.

When the lower electrode layer is to be prevented from also serving as the diaphragm, the lower electrode layer and the upper electrode layer are desirably formed at a thickness of 10 nm to several µm.

In the present invention in which the piezoelectric film of the piezoelectric actuator is controlled so as to become the {100} single-orientation film or the single-crystalline piezoelectric film having the {110} plane perpendicular to axis $A_2$, the crystal structure of the lower electrode layer is important. Specifically, when the diaphragm, the lower electrode layer, the piezoelectric film, and the upper electrode layer are formed in the stated order for the piezoelectric actuator, the crystal structure of the lower electrode layer is important. Even when the diaphragm, a buffer layer, the lower electrode layer, the piezoelectric film, and the upper electrode layer are formed in the stated order, the crystal structure of the lower electrode layer is important in order to control the crystal state of the piezoelectric film as described above.

In this case, examples of a material which can be suitably used to form the lower electrode layer can include metal oxide materials such as $SrTiO_3$ doped with one of La and Nb, $SrRuO_3$ (SRO), $BaPbO_3$, $LaNiO_3$, and $Pb_2Ir_2O_7$. Of the materials, in particular, $SrRuO_3$ (SRO) can be suitably used.

When the upper electrode layer, the piezoelectric film, and the lower electrode layer are to be formed in the stated order by a transfer method, the crystal structure of the upper electrode layer is important. Therefore, the metal oxide can be suitably used to form the lower electrode layer.

[Diaphragm]

The diaphragm is a constituent element essential to make the piezoelectric actuator according to the present invention serve as the bending mode type piezoelectric actuator for effectively obtaining a displacement of the piezoelectric film in the lateral vibration mode.

Examples of a principal material used for the diaphragm can include Si and oxides such as $ZrO_2$ doped with a rare-earth element containing Sc and Y, $BaTiO_3$, MgO, $SrTiO_3$, and $MgAl_2O_4$. Note that the Si may contain a dopant element such as B.

[Buffer Layer]

In the present invention, the piezoelectric film is controlled so as to become the {100} single-orientation film or the single-crystalline piezoelectric film having the {110} plane perpendicular to the axis $A_2$. In this case, the buffer layer may be formed between the diaphragm and the lower electrode layer. The buffer layer may serve as the diaphragm or have multiple layers.

The buffer layer is desirably made of a material in which a difference between a lattice constant thereof and a lattice constant of the substrate is within a range equal to or smaller than 8%. The material of the buffer layer is desirably an oxide which can be formed by one of a sputtering method, an MOCVD method, a laser ablation method. The buffer layer is desirably made of a material having a crystal structure which includes one of cubic crystal and pseudo cubic crystal and has a lattice constant of 3.6 angstroms to 6.0 angstroms.

Specifically, the buffer layer can be made of, for example, any one of the following materials.

10% $Y_2O_3$—$ZrO_2$(100)/Si(100)
10% $Y_2O_3$—$ZrO_2$(111)/Si(111)
$SrTiO_3$(100)/MgO(100)
$MgAl_2O_4$(100)/MgO(100)
$BaTiO_3$(001)/MgO(100)

The lattice constants of the materials described above are as follows.

10% $Y_2O_3$—$ZrO_2$: 5.16 angstroms
$SrTiO_3$: 3.91 angstroms
MgO: 4.21 angstroms
$MgAl_2O_4$: 4.04 angstroms
$BaTiO_3$: 3.99 angstroms
Si: 5.43 angstroms When 10% $Y_2O_3$—$ZrO_2$(111)/Si(111) is used as an example, the matching of the lattice constants is evaluated as follows. That is, the lattice constant of 10% $Y_2O_3$—$ZrO_2$ (111) is 7.30 (=5.16×√2) angstroms, and the lattice constant of Si(111) is 7.68 (=5.43×√2) angstroms. Therefore, a lattice constant difference between Si(111) and 10% $Y_2O_3$—$ZrO_2$ (111) is 4.9% (=100×[(7.68−7.30)]/7.68). Thus, it is found that the matching of the lattice constants is good.

[Liquid Discharge Head]

Figure 4:
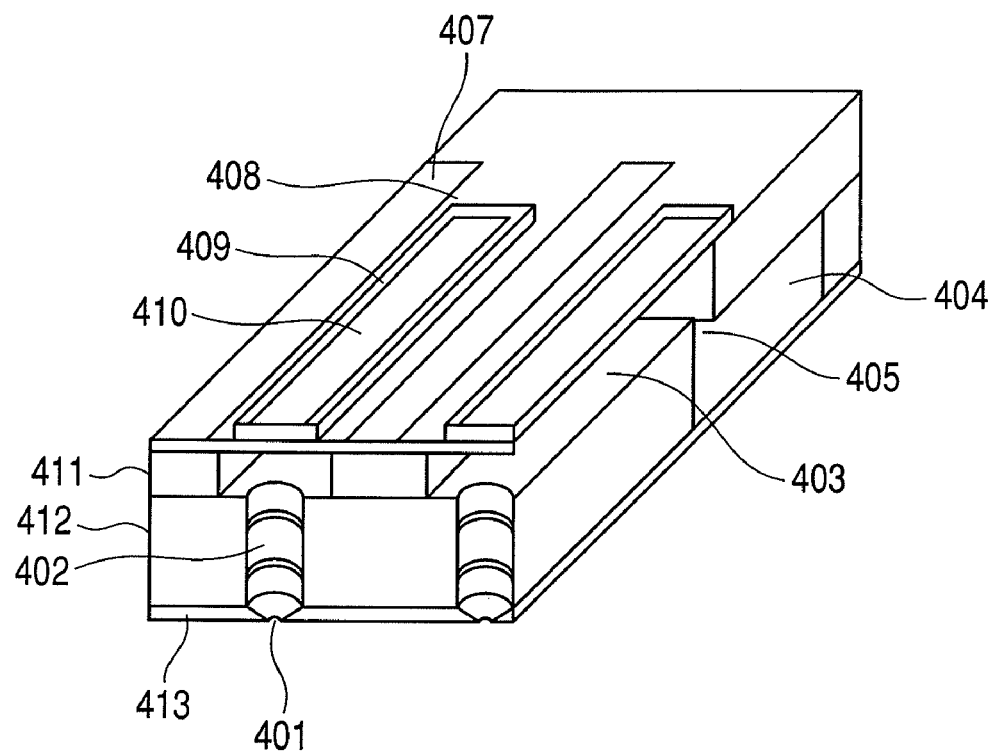
FIG. 4 is a schematic view illustrating an example of a liquid discharge head according to the embodiments of the present invention.

Next, a liquid discharge head according to the present invention using the piezoelectric actuator according to the present invention will be described. FIG. 4 is a schematic view illustrating an example of the liquid discharge head according the present invention. The liquid discharge head illustrated in FIG. 4 includes discharge ports 401 formed in discharge port surface 413, separate liquid chambers 403 separated by chamber forming member 411, communication holes 402 formed through member 412 for communicating the separate liquid chambers 403 with the discharge ports 401, a common liquid chamber 404, and a regulation portion 405 for regulating a flow of ink between the separate liquid chambers 403 and the common liquid chamber 404. The liquid discharge head further includes diaphragms 407, lower electrode layers 408, piezoelectric films 409, and upper electrode layers 410. The shapes of the constituent elements are not limited to the shapes illustrated in FIG. 4. The piezoelectric actuator in this example includes the diaphragms 407, the lower electrode layers 408, the upper layer electrodes 410, and the piezoelectric films 409 sandwiched between the lower electrode layers 408 and the upper layer electrodes 410.

Figure 5:
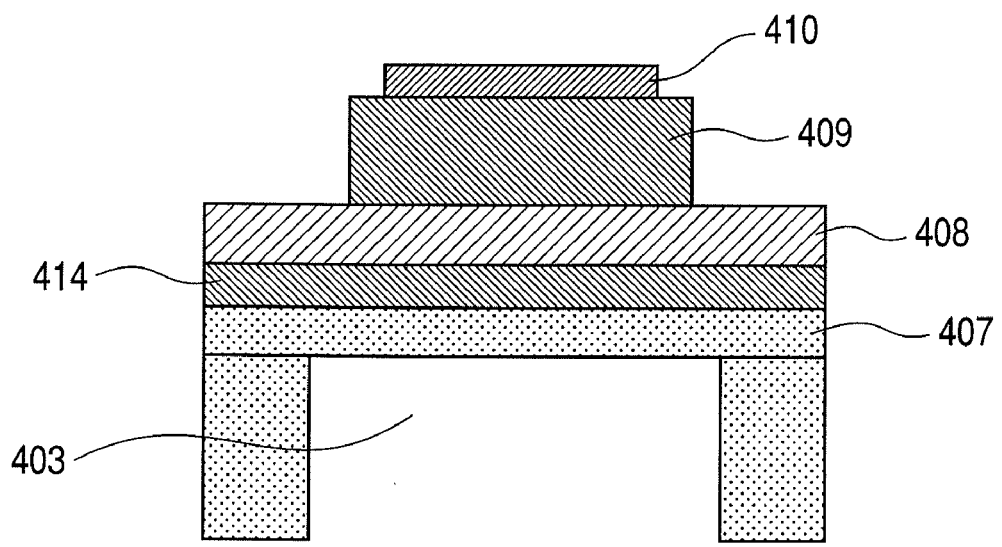
FIG. 5 is a schematic view illustrating a cross section of a piezoelectric film in a width direction thereof in the liquid discharge head according to the present invention.

A portion related to the piezoelectric film 409 in the present invention will be described in more detail with reference to FIG. 5. FIG. 5 is a cross sectional view illustrating the piezoelectric film 409 of the liquid discharge head of FIG. 4 in a width direction thereof. The diaphragm 407 and the lower electrode layer 408 are also illustrated in FIG. 5. The liquid discharge head may include a buffer layer 414 which has a function of controlling, for example, crystallinity and is located between the diaphragm 407 and the lower electrode layer 408. The buffer layer 414 may serve as the diaphragm or have a multilayer structure. Each of the lower electrode layer 408 and the upper electrode layer 410 may have a multilayer structure for improving adhesion level. A cross sectional shape of the piezoelectric film 409 is illustrated as a rectangular shape. However, the cross sectional shape is not limited thereto.

The lower electrode layer 408 extends to a region in which the piezoelectric film 409 is not provided. The upper electrode layer 410 extends to an opposite side (not shown) to the lower electrode layer 408 and is connected with a drive power supply. FIGS. 4 and 5 illustrate a state after the lower electrode layer is formed by patterning. However, the lower electrode may be provided even in the region in which the piezoelectric film is not provided.

The diaphragm 407 of the liquid discharge head according to the present invention has a thickness of desirably 1.0 μm to 10 μm, and more desirably 1.0 μm to 6.0 μm. When the buffer layer 414 is provided, the thickness is assumed to include a thickness of the buffer layer 414. A film thickness of each of the lower electrode layer 408 and the upper electrode layer 410 is desirably 0.05 μm to 0.4 μm, and more desirably 0.08 μm to 0.2 μm.

Figure 6:
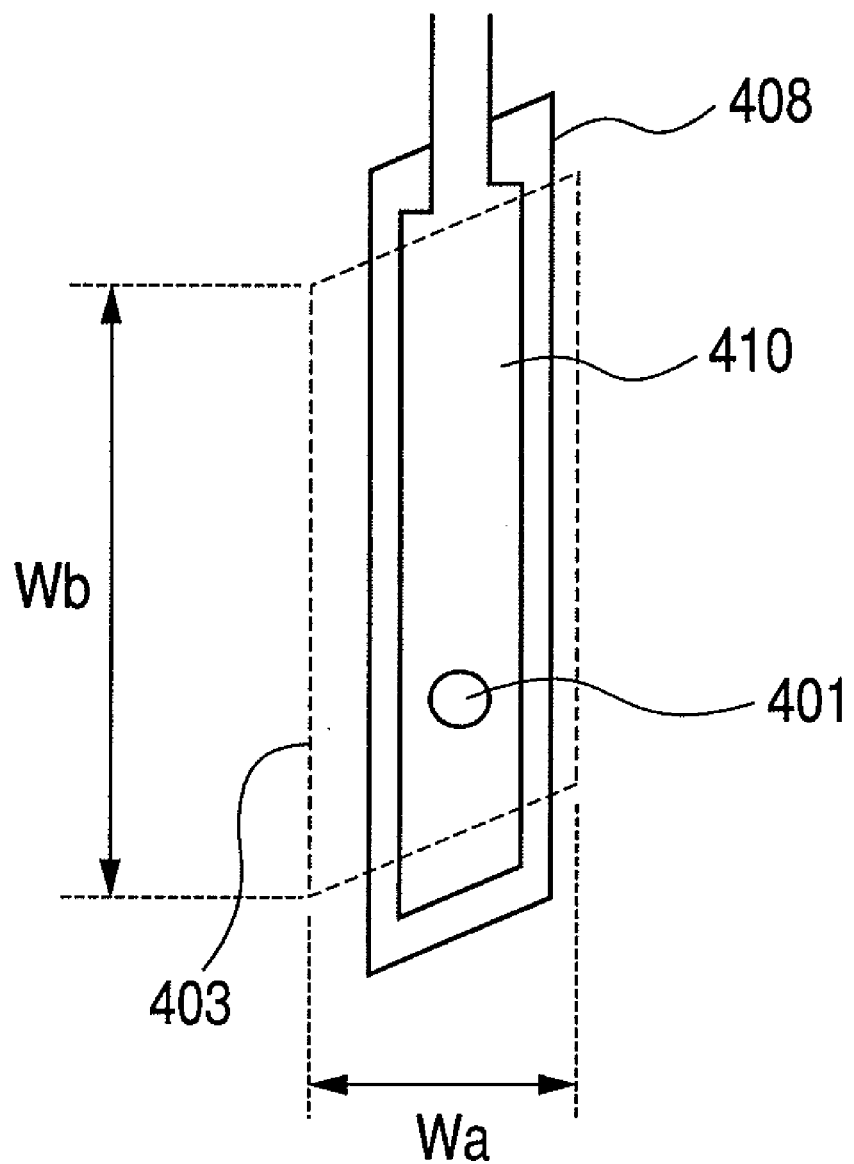
FIG. 6 is a schematic view illustrating a structure of a unit of the liquid discharge head according to the present invention.

FIG. 6 illustrates a structure of a unit of the liquid discharge head according to the present invention. A width Wa of the separate liquid chamber 403 is desirably 30 μm to 180 μm. A length Wb of the separate liquid chamber 403 is desirably 0.3 mm to 6.0 mm, although the length depends on the amount of discharge liquid droplets. A shape of the discharge port 401 is desirably a circular shape and a diameter thereof is desirably 7 μm to 30 μm. The discharge port 401 desirably has a tapered shape which increases in size in a direction of the communication hole 402 (see FIG. 4). A length of the communication hole 402 is desirably 0.05 mm to 0.5 mm. When the length of the communication hole exceeds such a range, it is likely to reduce a discharge speed of the liquid droplets. On the other hand, when the length of the communication hole is smaller than this range, it is likely to increase a variation in discharge speeds of the liquid droplets discharged from the respective discharge ports.

[Ink Jet Recording Apparatus]

An ink jet recording apparatus for which the liquid discharge head according to the present invention can be suitably used will be described.

Figure 7:
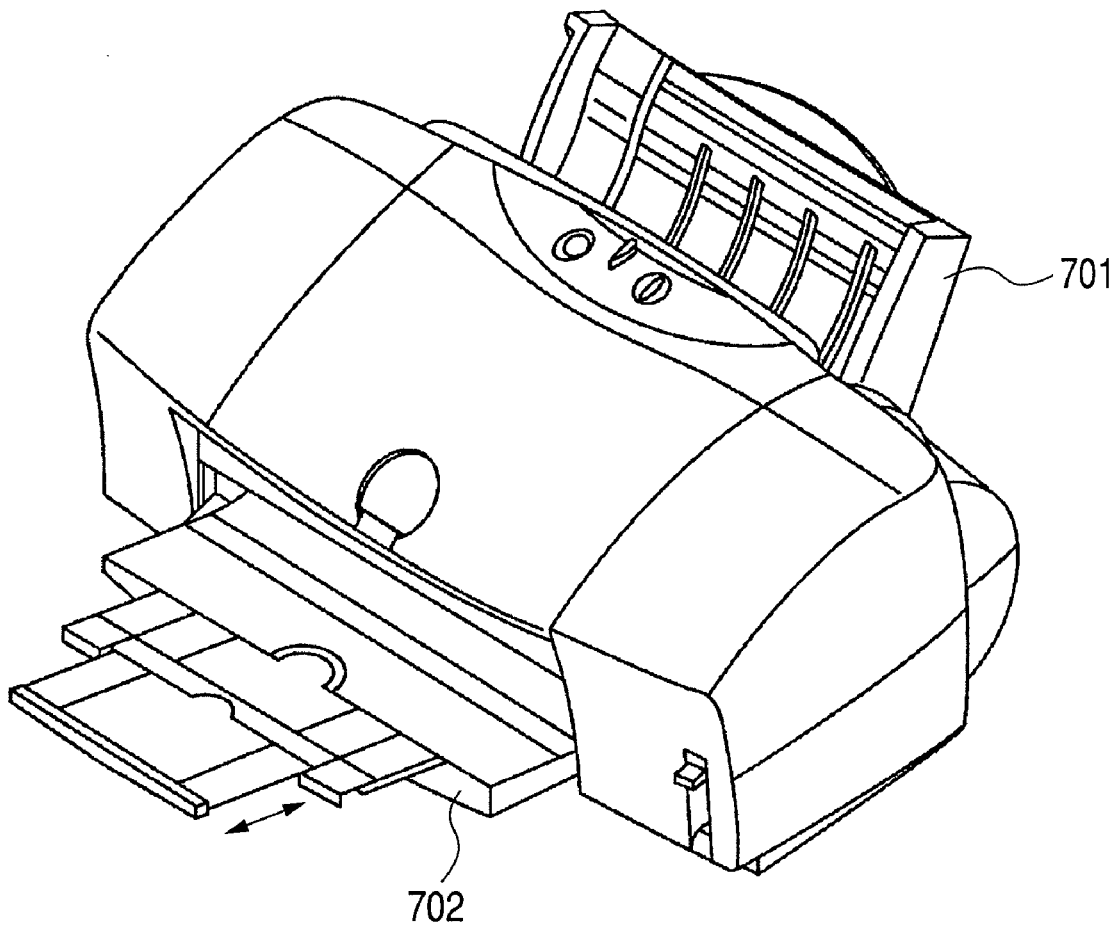
FIG. 7 is a schematic view illustrating an example of an ink jet recording apparatus using the liquid discharge head according to the present invention.
Figure 8:
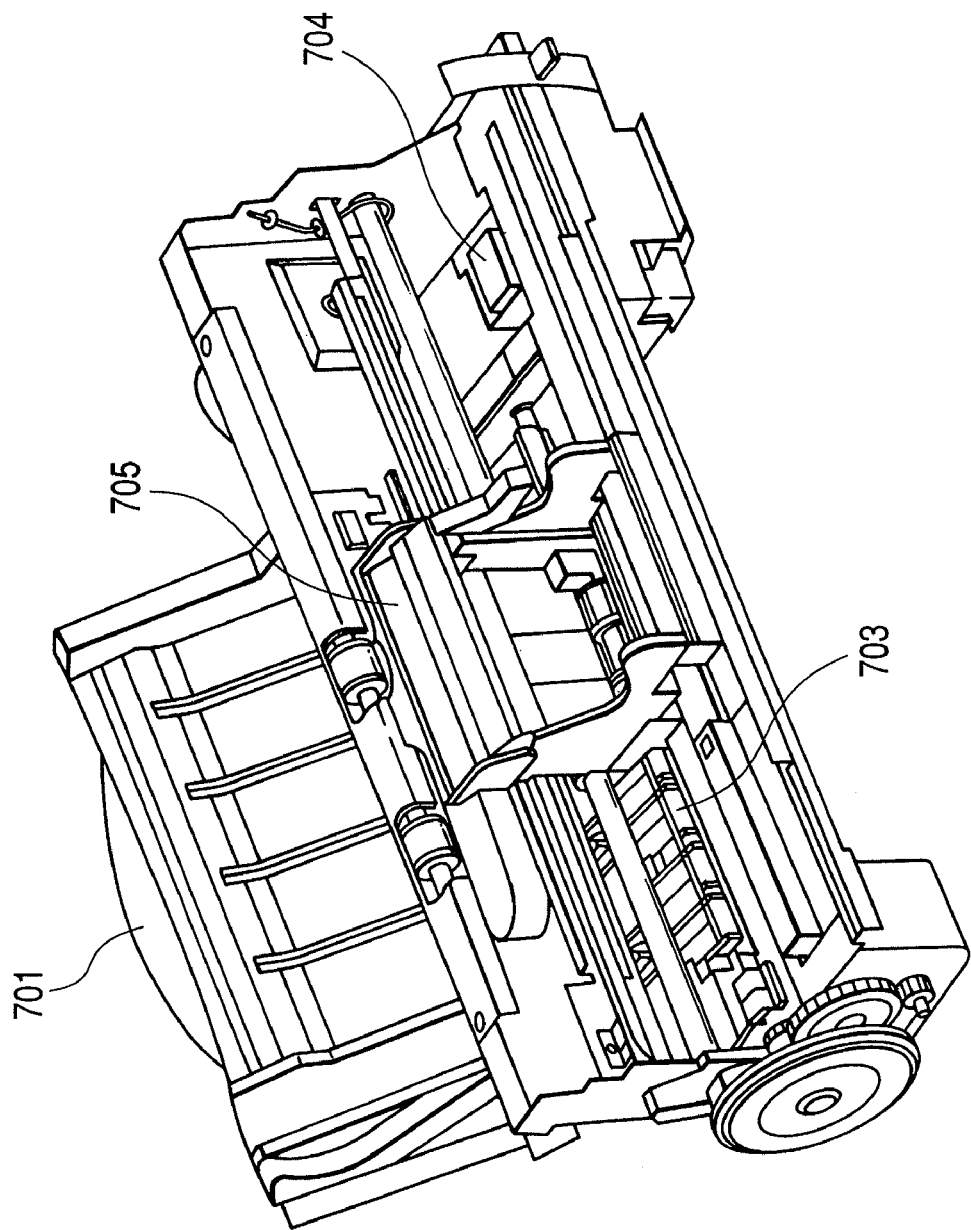
FIG. 8 is a schematic view illustrating an operation mechanism portion of the ink jet recording apparatus of FIG. 7.

FIG. 7 is a schematic view illustrating the ink jet recording apparatus using the liquid discharge head according to the present invention. FIG. 8 is a schematic view illustrating an operation mechanism portion of the ink jet recording apparatus of FIG. 7, from which an outer package is removed.

As illustrated in FIGS. 7 and 8, the ink jet recording apparatus includes an automatic feed portion 701, a transport portion 703, a recording portion, a recovery portion 704, and a carriage 705. A recording sheet which is a recording medium is automatically fed from the automatic feed portion 701 to an inner portion of the ink jet recording apparatus. The recording sheet fed from the automatic feed portion 701 is led to a predetermined recording position by the transport portion 703, and recording is performed on the recording sheet by the recording portion. After that, the recording sheet is transported from the recording position to an outlet 702. Recovery processing on the recording portion is performed by the recovery portion 704. The liquid discharge head according to the present invention is attached to the carriage 705 and used.

The example of the ink jet recording apparatus is described as the apparatus for which the liquid discharge head according to the present invention can be suitably used. The liquid discharge head according to the present invention can be used for a facsimile machine, a complex machine, a copying machine, and an industrial discharge apparatus.

EXAMPLES

Hereinafter, the present invention will be described in more detail in Examples 1 to 4 and Comparative Example 1. Note that the present invention is not limited thereto.

Example 1

A process for manufacturing the piezoelectric actuator and the liquid discharge head according to the present invention will be described with reference to the drawings. FIGS. 9A to 9G are structural cross sectional diagrams illustrating the process for manufacturing the piezoelectric actuator and the liquid discharge head according to the present invention.

An SOI substrate 901 is a 6-inch SOI substrate and includes an Si (100) layer 902 whose thickness is 200 μm, an $SiO_2$ layer 903 whose layer thickness is 0.3 μm, and an Si (100) layer 904 whose layer thickness is 3 μm. The SOI substrate whose orientation flat surface is Si {110} of the Si (100) layer 904 was used (see FIG. 9A).

A Pt {111} single-orientation film whose thickness is 0.15 μm was formed on the Si (100) layer 904 of the SOI substrate 901 at a substrate temperature of 200° C. by DC sputtering film formation to form a first lower electrode layer 905. Next, an $LaNiO_3$ (LNO) film was formed on the first lower electrode layer 905 in an $Ar/O_2$ atmosphere at a substrate temperature of 500° C. by RF reactive sputtering film formation to form an LNO {100} single-orientation film, thereby forming a second lower electrode layer 906 (see FIG. 9B).

Then, a baking target whose target composition (ratio of amount of atom) Pb:Zr:Ti is 110:54:46 was prepared. The baking target was used to perform RF reactive sputtering film formation at a substrate temperature of 600° C., thereby forming, as a piezoelectric film 907, a $Pb(Zr,Ti)O_3$ (PZT) {100} single-orientation film whose thickness is 3.0 μm (see FIG. 9C).

The obtained piezoelectric film 907 was subjected to X-ray structural analysis. As a result, it was determined that the piezoelectric film 907 is the (PZT) {100} single-orientation film.

Next, a process for manufacturing the liquid discharge head using a base having a stacked structure obtained by forming the lower electrode layers 905 and 906 and the piezoelectric film 907 on the SOI substrate 901 will be described.

Figure 9A:
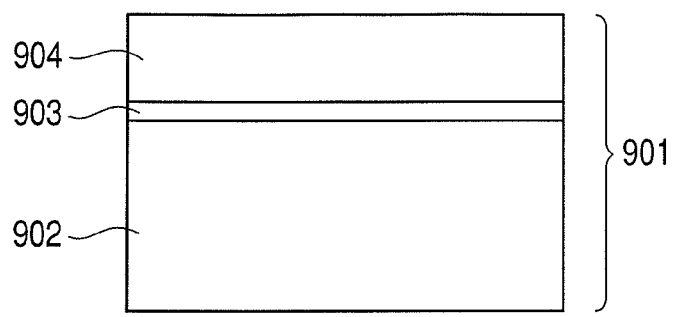
FIG. 9A is a structural cross sectional diagram illustrating a process for manufacturing the liquid discharge head according to the present invention, which illustrates an example of an SOI substrate.
Figure 9B:
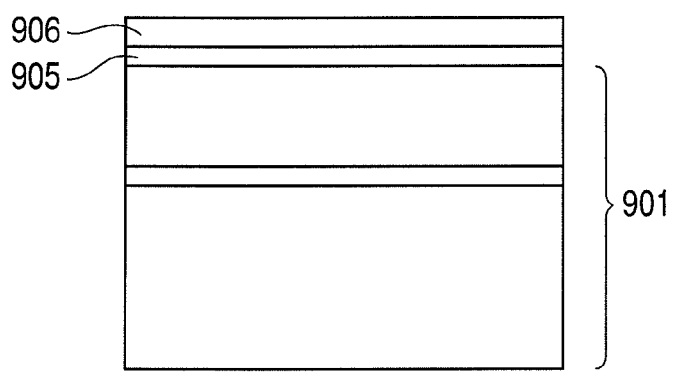
FIG. 9B is a structural cross sectional diagram illustrating the process for manufacturing the liquid discharge head according to the present invention, which illustrates a state in which first and second lower electrode layers are provided on the SOI substrate.
Figure 9C:
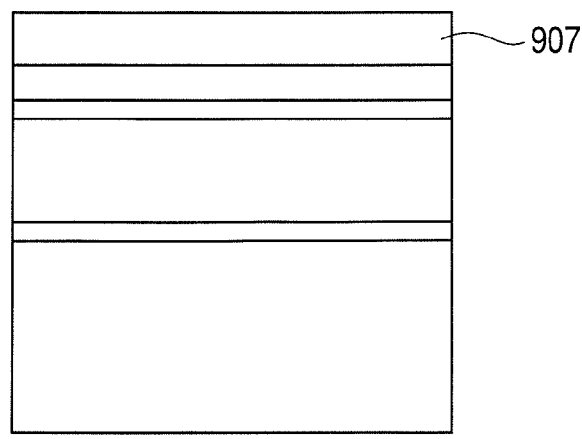
FIG. 9C is a structural cross sectional diagram illustrating the process for manufacturing the liquid discharge head according to the present invention, which illustrates a state in which a piezoelectric film is provided on the lower electrode layers.
Figure 9D:
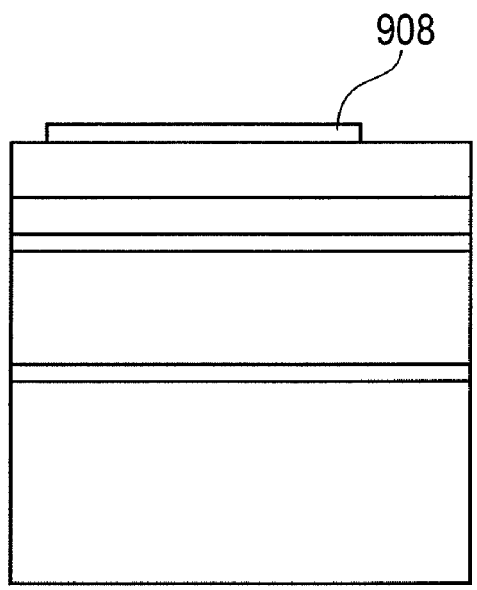
FIG. 9D is a structural cross sectional diagram illustrating the process for manufacturing the liquid discharge head according to the present invention, which illustrates a state in which an upper electrode layer is provided on the piezoelectric film.

An Au film was formed with a thickness of 200 nm on the piezoelectric film 907 of the base having the stacked structure by a DC sputtering method as an upper electrode layer 908 obtained by patterning of 0.3 mm×5 mm, which corresponds to the shape of each of the separate liquid chambers and the shape of the diaphragm in the liquid discharge head (see FIG. 9D).

Figure 9E:
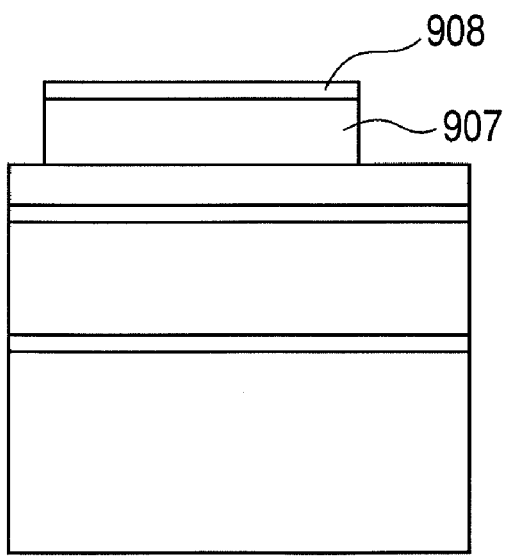
FIG. 9E is a structural cross sectional diagram illustrating the process for manufacturing the liquid discharge head according to the present invention, which illustrates a state in which a portion of the piezoelectric film which is not masked with the upper electrode layer is removed by a dry etching process.

Then, a portion of the piezoelectric film 907 on which the upper electrode layer 908 was not formed was removed by a dry etching process using the upper electrode layer 908 obtained by patterning as a mask (see FIG. 9E).

Figure 9F:
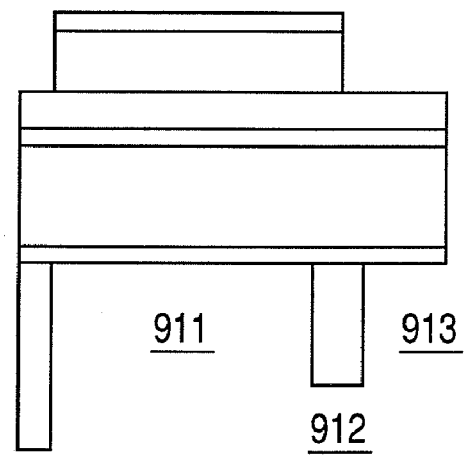
FIG. 9F is a structural cross sectional diagram illustrating the process for manufacturing the liquid discharge head according to the present invention, which illustrates a state in which a separate liquid chamber, a regulation portion, and a common liquid chamber are provided in the SOI substrate.
Figure 9G:
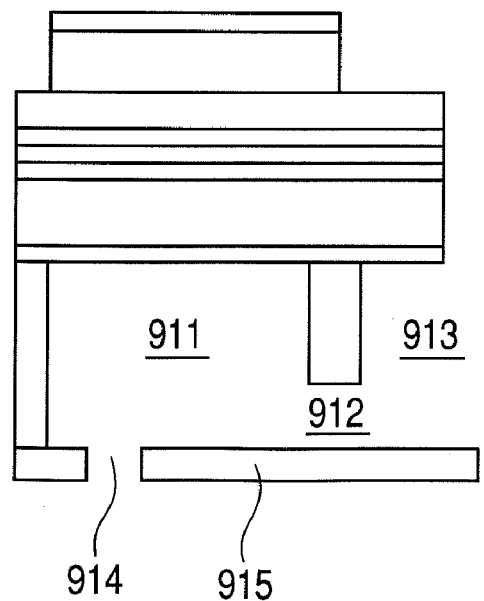
FIG. 9G is a structural cross sectional diagram illustrating the process for manufacturing the liquid discharge head according to the present invention, which illustrates a state in which a nozzle plate is bonded to the SOI substrate provided with the separate liquid chamber, the regulation portion, and the common liquid chamber.

Then, the Si (100) substrate 902 of the SOI substrate 901 was etched in two steps by the dry etching process to form a separate liquid chamber 911, a regulation portion 912, and a common liquid chamber 913 (see FIG. 9F).

Then, a nozzle plate 915 which has a discharge port 914 of 30 μmΦ and is made of stainless steel (SUS) whose thickness is 50 μm was separately prepared. The nozzle plate 915 was bonded to SOI substrate 901 with an organic adhesive to manufacture the liquid discharge head (see FIG. 9G).

In this case, the $SiO_2$ layer 903 and the Si (100) layer 904 whose layer thickness is 3 μm serve as the diaphragm of the piezoelectric actuator.

Figure 10A:
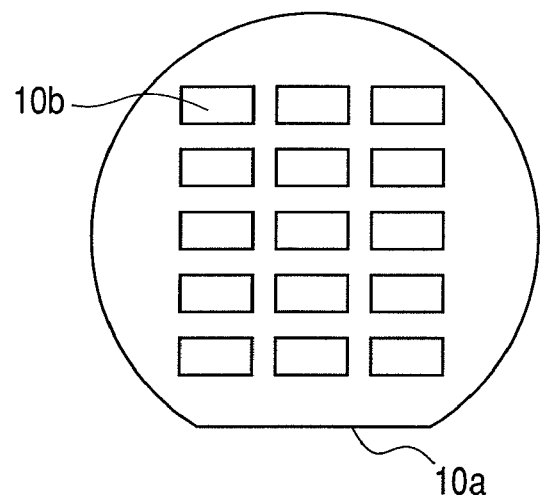
Figure 10B:
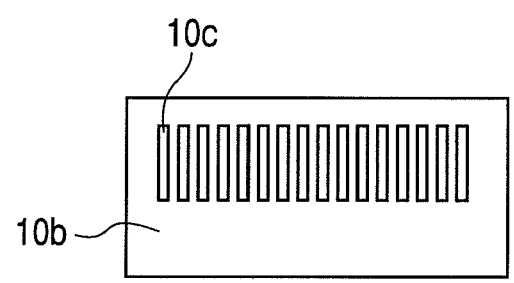
Figure 10C:
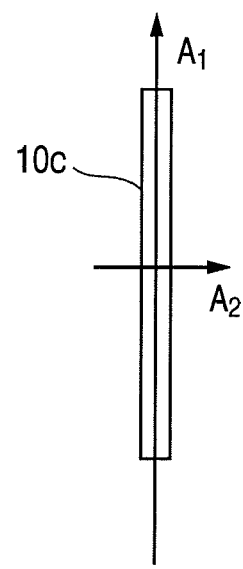

Relationships between the SOI substrate 901 and the shape of the diaphragm of the manufactured piezoelectric actuator are illustrated in FIGS. 10A to 10C. FIG. 10A illustrates cutting of chips of liquid discharge heads manufactured on the used SOI substrate 901 and the shape of the diaphragm, viewed from an upper electrode layer side. The SOI substrate 901 has an orientation flat surface 10a whose plane orientation is {110}. Manufactured liquid discharge heads 10b are cut out into a rectangular shape. The four sides of each of the liquid discharge heads are aligned with the {110} plane of the Si (100) layer 904 serving as the diaphragm.

FIG. 10B illustrates the shape and arrangement of diaphragms 10c of the respective piezoelectric actuators of the manufactured liquid discharge heads 10b, viewed from the upper electrode layer side. Each of the manufactured liquid discharge heads 10b includes the piezoelectric actuator with the diaphragms 10c. The four sides of each of the diaphragms 10c (each having a rectangular shape (0.3 mm×5 mm)) of the piezoelectric actuator 10b are aligned with the {110} plane of the Si (100) layer 904 serving as the diaphragm.

FIG. 10C illustrates a relationship between the shape of the diaphragm 10c of the piezoelectric actuator manufactured in this example and the axes $A_1$ and $A_2$ which are specified in the present invention. FIG. 10C illustrates the shape of the diaphragm 10c, viewed from the upper electrode layer side. The diaphragm 10c corresponds to a portion including the second lower electrode layer, the first lower electrode layer, the Si (100) layer, and the $SiO_2$ layer, which are cut by side wall surfaces of the piezoelectric film when the side wall surfaces extend downwardly (see FIG. 9G). In this case, the shape of the diaphragm 10c corresponds to the shape of the second lower electrode layer on the surface thereof which is in contact with the piezoelectric film. The shape of the diaphragm 10c of the piezoelectric actuator is a rectangle, and thus an intersection of the two symmetry axes of the rectangle corresponds to the point $P\delta_{MAX}$ specified in the present invention, and there are the two points $P\delta_A$ on the longitudinal symmetry axis of the shape of the diaphragm. Therefore, in the piezoelectric actuator according to this example, the relationship between the shape of the diaphragm and the axes $A_1$ and $A_2$ is obtained as illustrated in FIG. 10C. That is, the diaphragm 10c is made of single-crystalline Si having the {110} plane which is orthogonal to the axis $A_1$ and perpendicular to the axis $A_2$ located on the flat surface of the diaphragm. As described above, the piezoelectric film is the {100} single-orientation film. Thus, the piezoelectric actuator manufactured in this example corresponds to the piezoelectric actuator according to the first embodiment of the present invention.

The performance of the liquid discharge head manufactured in this example was measured. The displacement amount at an applied voltage of 30 V was measured using a fringe counter, and a resonance frequency of the liquid discharge head was measured using an impedance analyzer. Results are summarized in Table 1.

Example 2

The SOI substrate 901 was prepared as in Example 1. A stabilized zirconia (10% $Y_2O_3$—$ZrO_2$ (YSZ)) film was formed on the Si (100) layer 904 in an $Ar/O_2$ atmosphere at a substrate temperature of 800° C. by RF reactive sputtering film formation to form, as a first buffer layer, a YSZ {100} single-crystalline film 1201 having a thickness of 0.1 μm. After that, a ceria ($CeO_2$) film was formed as a second buffer layer in an $Ar/O_2$ atmosphere at a substrate temperature of 500° C. by RF reactive sputtering film formation to form a ceria {100} single-crystalline film 1202 having a thickness of 0.1 μm. Then, an LNO film was formed as the first lower electrode layer in an $Ar/O_2$ atmosphere at a substrate temperature of 500° C. by RF reactive sputtering film formation to form an LNO {100} single-crystalline film 1203 having a thickness of 0.1 μm. Then, an $SrRuO_3$ (SRO) film was formed as the second lower electrode layer in an $Ar/O_2$ atmosphere at a substrate temperature of 600° C. by RF reactive sputtering film formation to form an SRO {100} single-crystalline film 1204 having a thickness of 0.2 μm.

Next, a baking target whose target composition (ratio of amount of atom) Pb:Zr:Ti is 110:54:46 was prepared. The baking target was used to perform RF reactive sputtering film formation at a substrate temperature of 600° C., thereby forming, as the piezoelectric film, a $Pb(Zr,Ti)O_3$ (PZT) {100} single-crystalline piezoelectric film 1205 whose thickness is 3.0 μm.

Figure 11:
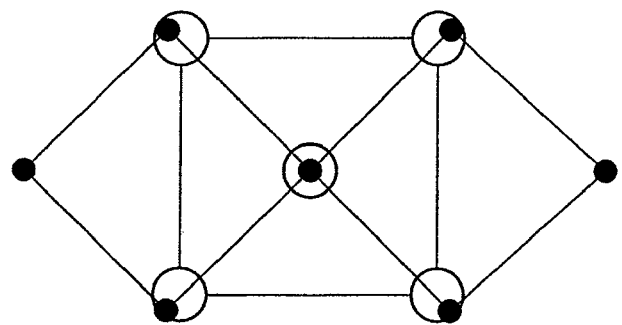
FIG. 11 illustrates a state of an LNO {100} single-crystalline film of the lower electrode layer which is epitaxially grown by 45'-in-plane rotation on a ceria {100} single-crystalline film serving as a buffer layer in Example 2.

A base having a stacked structure including the obtained piezoelectric film was subjected to X-ray diffraction measurement (Φ scanning). It was determined that the YSZ {100} single-crystalline film 1201 and the ceria {100} single-crystalline film 1202 formed on the Si (100) layer 904 have four-fold symmetry. It was also determined that the LNO {100} single-crystalline film 1203, the SRO {100} single-crystalline film 1204, and the PZT {100} single-crystalline piezoelectric film 1205 have four-fold symmetry. Therefore, it was determined that each of the films described above is a single-crystalline film which is epitaxially grown. Further, it was determined that a peak appearance angle of a set of the Si (100) layer 904, the YSZ {100} single-crystalline film, and the ceria {100} single-crystalline film is shifted by 45° from a peak appearance angle of a set of the LNO {100} single-crystalline film, the SRO {100} single-crystalline film, and the PZT {100} single-crystalline piezoelectric film. This results from the fact that the LNO {100} single-crystalline film 1203 is epitaxially grown on the ceria {100} single-crystalline film 1202 by 45'-in-plane rotation between the ceria {100} single-crystalline film 1202 and the LNO {100} single-crystalline film 1203 as illustrated in FIG. 11.

Figure 12:
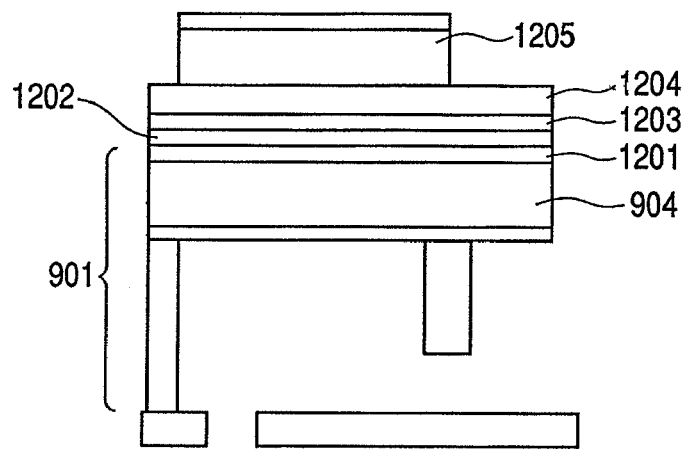
FIG. 12 is a structural cross sectional diagram illustrating a liquid discharge head according to Example 2.

After that, the liquid discharge head was manufactured as in Example 1. FIG. 12 is a structural cross sectional diagram illustrating the liquid discharge head manufactured in this example.

The performance of the manufactured liquid discharge head was evaluated as in Example 1. Results are summarized in Table 1.

Example 3

The liquid discharge head was manufactured and evaluated as in Example 2 except that a baking target whose target composition (ratio of amount of atom) Pb:Mg:Nb:Ti is 110:22:44:33 was prepared and used to form, as the piezoelectric film, a $(Pb(Mn_{0.33},Nb_{0.67})O_3)_{0.67}$—$(PbTiO_3)_{0.33}$ (PMN-PT) {100} single-crystalline piezoelectric film 1205. Results are summarized in Table 1.

Example 4

The liquid discharge head was manufactured and evaluated as in Example 2 except that the shape of the diaphragm 10c illustrated in FIGS. 10B and 10C was changed into the parallelogram shape illustrated in FIG. 1D. Results are summarized in Table 1. The parallelogram shape of the diaphragm which is employed in this example is an example of the shape with the symmetry center. The symmetry center corresponds to the point $P\delta_{MAX}$. In this case, the point $P\delta_A$ on the surface of the diaphragm, which is located on the circumference of the reference circle whose center is the point $P\delta_{MAX}$ and radius is smaller than the distance to the end portion of the diaphragm and which has the minimum difference in displacement amount from the point $P\delta_{MAX}$, is located on the line which passes through the point $P\delta_{MAX}$ and is parallel to the long side of the parallelogram. In other words, the axis $A_1$ specified in the present invention is identical to the line which passes through the point $P\delta_{MAX}$ and is parallel to the long side of the parallelogram.

Comparative Example 1

An Si (100) substrate 1301 whose size is 6 inches, thickness is 200 μm, and orientation flat surface is {110} was prepared as a substrate. A substrate temperature was set to 600° C. to perform RF reactive sputtering film formation, thereby forming a strontium titanate (SrTiO₃ (STO)) {100} single-crystalline film 1302 which serves as the diaphragm and has a thickness of 2 μm. Then, an SRO {100} single-crystalline film 1303 which serves as the lower electrode layer and has a thickness of 0.2 μm was formed on the STO {100} single-crystalline film 1302 by RF reactive sputtering.

Next, a baking target whose target composition (ratio of amount of atom) Pb:Zr:Ti is 110:54:46 was prepared. The baking target was used to perform RF reactive sputtering film formation at a substrate temperature of 600° C., thereby forming, as the piezoelectric film, a Pb(Zr,Ti)O₃ (PZT) {100} single-crystalline piezoelectric film 1304 whose thickness is 3.0 μm.

A base having a stacked structure including the obtained piezoelectric film was subjected to X-ray diffraction measurement (Φ scanning). It was determined that the STO {100} single-crystalline film 1302, the SRO {100} single-crystalline film 1303, and the PZT {100} single-crystalline piezoelectric film 1304 which are formed on the Si (100) substrate 1301 have four-fold symmetry. Therefore, it was determined that each of the films described above is a single-crystalline film which is epitaxially grown. Further, it was determined that a peak appearance angle of the Si (100) substrate 1301 is shifted by 45° from a peak appearance angle of a set of the STO {100} single-crystalline film 1302, the SRO {100} single-crystalline film 1303, and the PZT {100} single-crystalline piezoelectric film 1304. This results from the fact that the STO {100} single-crystalline film is epitaxially grown on the Si (100) substrate 1301 by 45'-in-plane rotation.

Figure 13:
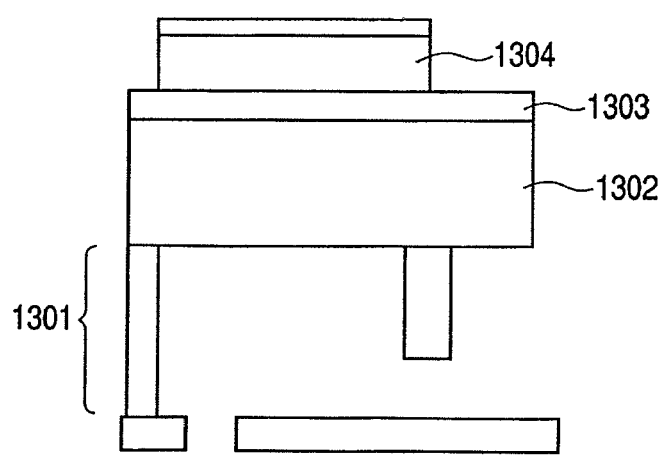
FIG. 13 is a structural cross sectional diagram illustrating a liquid discharge head according to Comparative Example 1.
Figure 14A:
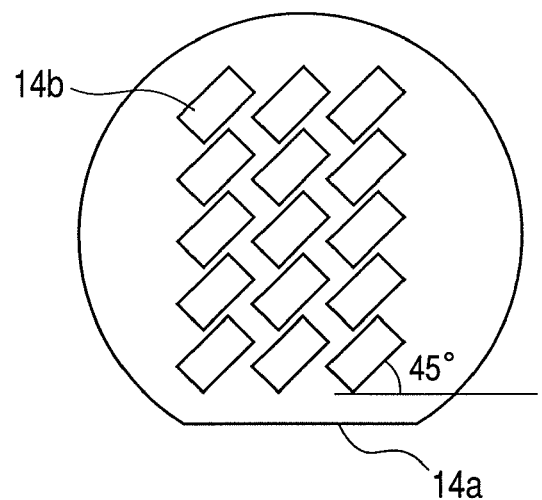
Figure 14B:
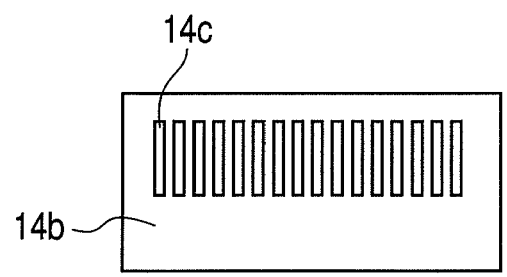
Figure 14C:
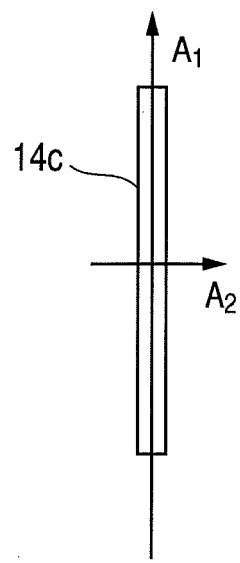

After that, the liquid discharge head was manufactured and evaluated as in Example 2 except that, as illustrated in FIG. 14A, the liquid discharge heads 14b were separated by cutting at an angle of 45° relative to an intersection line between an orientation flat surface {110} 14a of the Si substrate and a surface of the Si substrate. Results are summarized in Table 1. FIG. 14B illustrates the shape and arrangement of diaphragms 14c of the respective piezoelectric actuators of the manufactured liquid discharge head. FIG. 14C illustrates a relationship between the shape of the diaphragm of the piezoelectric actuator and the axes $A_1$ and $A_2$. FIG. 13 is a structural cross sectional diagram illustrating the manufactured liquid discharge head.

As illustrated in FIG. 14A, when the liquid discharge heads 14b are separated by cutting, the diaphragm of the piezoelectric actuator which is made of STO {100} single crystal is the single-crystalline piezoelectric film having the {100} plane perpendicular to the axis $A_2$.

TABLE 1

| | Diaphragm | | Piezoelectric film | | | |
|---|---|---|---|---|---|---|
| | Material | Plane perpendicular to axis $A_2$ ($A_2'$) | Material | Axis with single orientation in film thickness direction or plane perpendicular to axis $A_2$ ($A_2'$) | Displacement amount [nm] | Resonance frequency [kHz] |
| Example 1 | Si | {110} | PZT | <100> | 200 | 51 |
| Example 2 | Si | {110} | PZT | {100} | 250 | 55 |
| Example 3 | Si | {110} | PMN-PT | {100} | 260 | 54 |
| Example 4 | Si | {110} | PZT | {100} | 240 | 56 |
| Comparative Example 1 | STO | {100} | PZT | {100} | 160 | 16 |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-260942, filed Oct. 4, 2007, which is hereby incorporated by reference herein in its entirety.

What is claimed is:
1. A piezoelectric actuator, comprising:
a diaphragm; and
a piezoelectric element provided on the diaphragm, including a pair of electrode layers and a piezoelectric film sandwiched between the pair of electrode layers,
wherein each elastic coefficient of the pair of electrode layers, the piezoelectric film and the diaphragm is isotropic in three-dimensional directions, an amount of distortion of the piezoelectric film which is caused by an electric field is isotropic in all in-plane directions of the piezoelectric film, a point, which is located on a principal surface of the diaphragm and has a maximum displacement amount when a predetermined electric field is applied between the pair of electrode layers and the piezoelectric film is distorted to bend the diaphragm by distortion, is expressed by $P\delta_{MAX}$, and a point, which is located on the surface of the diaphragm and on a circumference of a circle having the point $P\delta_{MAX}$ as a center and a radius smaller than a distance between an end portion of the diaphragm and the point $P\delta_{MAX}$ and has a minimum difference in displacement amount from the point $P\delta_{MAX}$, is expressed by $P\delta_A$,
the diaphragm has a shape capable of uniquely determining an axis $A_1$ located on the principal surface of the diaphragm when the diaphragm is not bent, and set in a direction of a straight line joining the point $P\delta_{MAX}$ and the point $P\delta_A$, the diaphragm comprises a single-orientation or a single-crystalline material in which a plane orthogonal to the axis $A_1$ and perpendicular to an axis $A_2$ located on the principal surface of the diaphragm is a {110} plane, and the piezoelectric film comprises a single-orientation or a single-crystalline piezoelectric film including a {100} plane perpendicular to the axis $A_2$.

2. A piezoelectric actuator according to claim 1, wherein the diaphragm comprises one of Si and a material including Si.

3. A piezoelectric actuator according to claim 1, wherein the diaphragm comprises a material including YSZ{100}/Si (100).

4. A piezoelectric actuator according to claim 1, wherein the diaphragm comprises a material including YSZ{100}/Si (100).

5. A piezoelectric actuator according to claim 1, wherein the electrode layer comprises an oxide layer having and $ABO_3$ type perovskite structure with a {100} single orientation.

6. A piezoelectric actuator according to claim 5, wherein the oxide electrode layer having the $ABO_3$ type perovskite structure comprises an $SrRuO_3$ (SRO) electrode layer.

7. A piezoelectric actuator according to claim 1, wherein the piezoelectric film comprises a PZT-based piezoelectric material.

8. A piezoelectric actuator according to claim 1, wherein the piezoelectric film comprises a relaxor-based piezoelectric material.

9. A piezoelectric actuator according to claim 8, wherein the relaxor-based piezoelectric material is expressed by any one of the following formulae:

$$(Pb(Mn,Nb)O_3)_{1-x}\text{---}(PbTiO_3)_x \qquad (1);$$

$$(Pb(Zn,Nb)O_3)_{1-x}\text{---}(PbTiO_3)_x \qquad (2);$$

$$(Pb(Ni,Nb)O_3)_{1-x}\text{---}(PbTiO_3)_x \qquad (3);$$

$$(Pb(In,Nb)O_3)_{1-x}\text{---}(PbTiO_3)_x \qquad (4);$$

$$(Pb(Sc,Nb)O_3)_{1-x}\text{---}(PbTiO_3)_x \qquad (5);$$

$$(Pb(Yb,Nb)O_3)_{1-x}\text{---}(PbTiO_3)_x \qquad (6); \text{ and}$$

$$(Pb(Sc,Ta)O_3)_{1-x}\text{---}(PbTiO_3)_x \qquad (7);$$

where x represents a real number of $0<x<1$.

10. A liquid discharge head using the piezoelectric actuator according to claim 1.

* * * * *